United States Patent [19]

Fuhrer

[11] 4,245,238

[45] Jan. 13, 1981

[54] NON-LINEAR PROCESSING OF VIDEO IMAGE VERTICAL DETAIL INFORMATION

[75] Inventor: Jack S. Fuhrer, Carmel, Ind.

[73] Assignee: RCA Corporation, New York, N.Y.

[21] Appl. No.: 38,203

[22] Filed: May 11, 1979

[51] Int. Cl.$^3$ .......................................... H04N 9/535
[52] U.S. Cl. ..................................... 358/31; 358/36; 358/37
[58] Field of Search ........................ 358/31, 32, 36, 37, 358/22, 39, 166, 167, 184, 164; 330/97, 103, 110, 282, 291; 307/230; 328/142, 143

[56] References Cited

U.S. PATENT DOCUMENTS

| | | | |
|---|---|---|---|
| 3,715,477 | 2/1973 | Olson et al. | 358/167 |
| 4,074,321 | 2/1978 | Miller | 358/31 |
| 4,096,516 | 1/1978 | Pritchard | 358/31 |

OTHER PUBLICATIONS

McMann et al., "Improved Signal Processing Techniques in Color Television Broadcasting", *Journal of SMPTE*, Mar., 1968, vol. 77, pp. 221–228.

*Primary Examiner*—John C. Martin
*Attorney, Agent, or Firm*—E. M. Whitacre; W. H. Meagher; R. H. Kurdyla

[57] ABSTRACT

In a color television receiver including a comb filter for separating luminance and chrominance components of a color television signal, a network is included for selectively restoring, enhancing and paring vertical image detail to preserve and enhance vertical resolution in the luminance content of a displayed image. The comb filter provides a combed luminance signal output from which vertical detail signal information has been unavoidably deleted, and a combed chrominance signal output including signal frequency components representative of the deleted detail signal, which are selectively extracted from the combed chrominance signal. Low level detail signals are restored to the combed luminance signal via a first signal processing network which exhibits a prescribed signal restoration gain. The detail signal is also combined with the combed luminance signal via a second signal processing network which cores (removes) low level detail signals including noise, enhances moderate level detail signals through amplification to enhance vertical image definition, and pares (amplitude reduces) high level detail signals. A resultant reconstituted luminance component manifests restored low level vertical detail information, enhanced moderate level vertical detail information without enhancing unwanted signal components such as noise, and pared high level detail signals to avoid excessive contrast.

4 Claims, 6 Drawing Figures

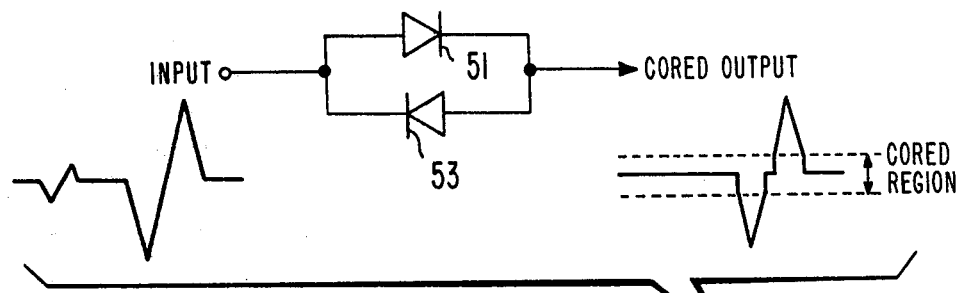
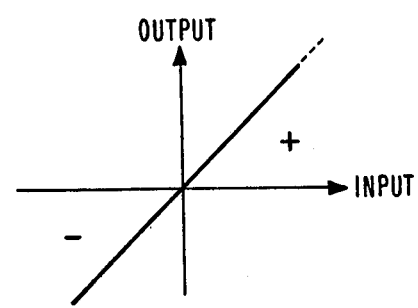
Fig. 2.
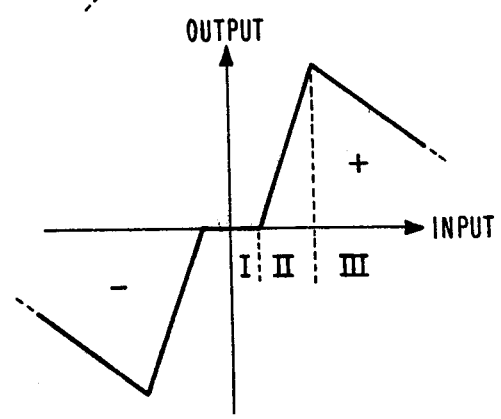
Fig. 3.
Fig. 4.
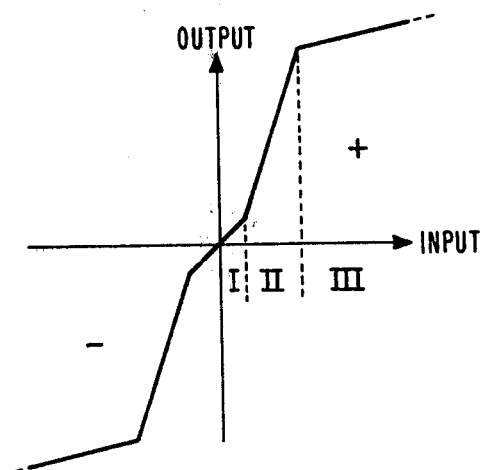
Fig. 5.

NON-LINEAR PROCESSING OF VIDEO IMAGE VERTICAL DETAIL INFORMATION

This invention concerns a network for providing restoration, enchancement, and paring of picture vertical detail information in a color television receiver including a comb filter or the like for separating the luminance and chrominance components of the television signal.

In a color television system such as the system developed by the United States, the luminance and chrominance components of a color television signal are disposed within the video frequency spectrum in frequency interleaved relation, with the luminance components at integral multiples of the horizontal line scanning frequency and the chrominance components at odd multiples of one-half the line scanning frequency. Various comb filter arrangements for separating the frequency interleaved luminance and chrominance components of the video signal are known, for example, from U.S. Pat. No. 4,143,397 (D. D. Holmes) and U.S. Pat. No. 4,096,516 (D. H. Pritchard) and the references cited therein.

A combed luminance signal which appears at the luminance output of the comb filter has been subjected to a "combing" effect over its entire band. The combing action over the high frequency band portion which is shared with chrominance signal components has the desired effect of deleting chrominance signal components. Extension of this combing action into the low frequency band portion which is not shared with the chrominance signal components, however, is not needed to effect the desired removal of chrominance signal components, and serves only to unnecessarily delete luminance signal components. Components in the lower end of this unshared band which are subject to such deletion are representative of "vertical detail" luminance information. Preservation of such vertical detail is desirable to avoid loss of vertical resolution in the luminance content of a displayed image.

One arrangement for preserving the vertical detail information employs a low pass filter coupled to the output of the comb filter at which the "combed" chrominance component appears. The upper cut-off frequency of this filter lies below the band occupied by the chrominance signal component (with an illustrative choice being just below 2 MHz). The filter selectively couples signals below the chrominance band from the chrominance output of the comb filter to a combining network where the selectively coupled signals are summed with combed luminance output signals from the comb filter. The combined signal includes a "combed" high frequency portion (occupying a band of frequencies above the filter cut-off frequency) from which chrominance signal components have been removed, and an uncombed (i.e., "flat") low frequency portion in which all luminance signal components have been preserved.

It is sometimes desirable to enhance the vertical detail information of a displayed image by adding back to the luminance signal a greater amount of the vertical detail signal than is required to restore the luminance signal to its original form (i.e., a "flat" amplitude characteristic). The additional vertical detail signal then serves to emphasize or peak vertical detail information so as to enhance picture detail resolution. For low level luminance signals, however, such enhancement tends to produce objectionable visible effects when noise interference is present and undesirably enhanced along with the vertical detail information of the luminance signal.

Also in this instance, alternate line set-up variations (ALSUV) when present in the video signal are also undesirably enhanced. The ALSUV phenomenon is a form of low level signal interference manifested by variations in the black level of the video signal from line-to-line, and may be caused by misalignment of signal processing systems at the broadcast transmitter, for example. The ALSUV interference is particularly noticeable for low level video signals of about five percent of the maximum expected video signal amplitude, and produces objectionable visible effects on a reproduced image which are undesirably magnified when vertical detail enhancement is provided.

A technique for minimizing the adverse effects of noise and other undesirable components of a video signal employs a process commonly referred to as signal "coring", wherein small amplitude excursions of the signal (including noise) are removed as described in U.S. Pat. No. 3,715,477 for example.

One technique employing coring of the vertical detail signal in a manner which does not impair (i.e., "smear") vertical detail information, particularly with regard to level detail signal information which is to be restored to the luminance signal, is described in a copending, concurrently filed U.S. patent application Ser. No. 38,202 of W. A. Lagoni and J. S. Fuhrer entitled, "Video Image Vertical Detail Restoration And Enhancement" and assigned to the present assignee. Apparatus described therein also advantageously provides for enhancement of the vertical detail information substantially without simultaneously enhancing interfering signal components such as noise and alternate line set-up variations.

Consistent with this technique, in accordance with the principles of the present invention it is herein recognized as desirable to "pare", or amplitude reduce, high level vertical detail signals to avoid excessive contrast in a displayed image, and to prevent kinescope "blooming" which can distort or obscure image detail.

Video image vertical detail signal processing apparatus according to the invention is included in a system for processing a video signal containing image representative luminance and chrominance components disposed within a frequency spectrum of said video signal in frequency interleaved relation. The system includes a comb filter for providing at a first output a combed luminance signal with amplitude peaks at integral multiples of an image line scanning frequency, and amplitude nulls at odd multiples of one-half the line frequency. The comb filter also provides at a second output a combed chrominance signal with amplitude peaks at odd multiples of one-half the line frequency, and amplitude nulls at integral multiples of the line frequency. Signals provided at the second output of the comb filter include signal frequencies representative of luminance vertical image detail information absent from the combed luminance signal at the first comb filter output. A filter network coupled to the second output of the comb filter selectively passes signal frequencies corresponding to the vertical detail signal information, to the exclusion of signals occupying the band of chrominance signal frequencies. Small amplitude excursions of the vertical detail signal are translated with a first gain greater than zero, moderate amplitude excursions of the vertical detail signal are translated with a second gain greater than the first gain, and large amplitude excursions of the vertical detail signal are translated with a third gain less than the first gain. The translated vertical detail signals are combined with the combed luminance signal from the first output of the comb filter to provide a reconstituted luminance component, which is afterwards supplied to a luminance signal utilization network.

In the drawing:

FIG. 2 shows a circuit suitable for use with the arrangement of FIG. 1;

FIGS. 3-5 depict amplitude response characteristics of the apparatus of FIG. 1, which are useful in understanding the operation of the invention.

Figure 1:
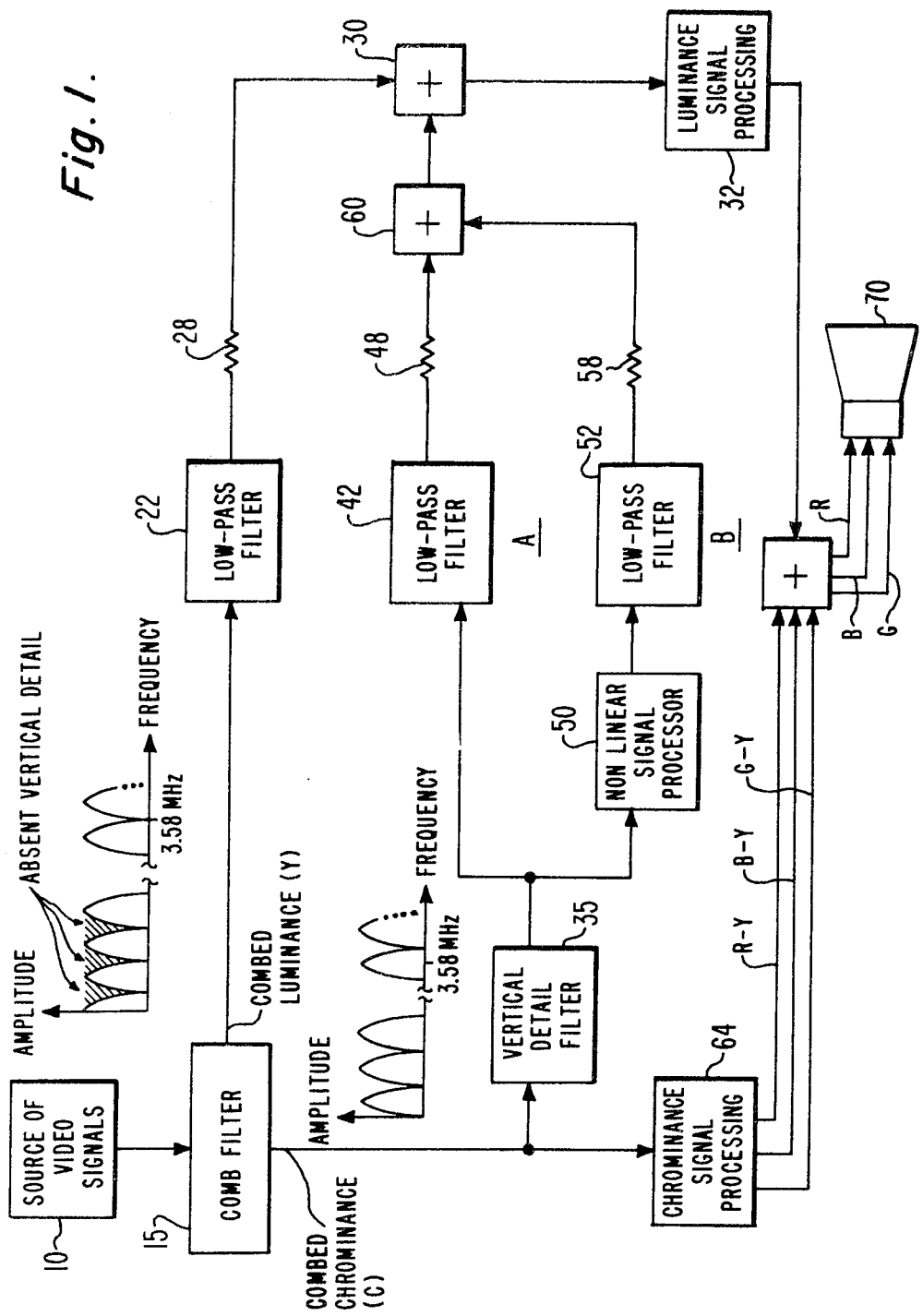
FIG. 1 illustrates a block diagram of a portion of a color television receiver employing apparatus according to the present invention.

In FIG. 1, a source of composite color video signals 10 including luminance and chrominance components supplies video signals to an input of a comb filter 15 of known configuration, such as a comb filter employing charge coupled devices (CCDs) as shown in U.S. Pat. No. 4,096,516. The luminance and chrominance components are arranged within the video signal frequency spectrum in frequency interleaved relation. The luminance component has a relatively wide bandwidth (extending from D.C. or zero frequency to about four megahertz). The upper frequency range of the luminance component is shared with the chrominance component, which comprises a subcarrier signal of 3.58 MHz amplitude and phase modulated with color information. The amplitude versus frequency response of comb filter 15 with respect to luminance combing action exhibits a peak amplitude response at integral multiples of the horizontal line scanning frequency (approximately 15,734 Hz), extending from D.C. or zero frequency, and an amplitude null at odd multiples of one-half the line scanning frequency, including the 3.58 MHz chrominance subcarrier frequency. The amplitude versus frequency response of comb filter 15 with respect to chrominance combing action exhibits a peak amplitude response at odd multiples of one-half the line frequency including 3.58 MHz, and an amplitude null at integral multiples of the line frequency.

A "combed" luminance signal (Y) from the luminance output of comb filter 15 is coupled via a low pass filter 22 and a weighting resistor 28 to one input of a signal combining network 30. Filter 22 is arranged to pass all luminance signals below a cut-off frequency of approximately 4 MHz, and serves to remove noise and clock frequency components of switching signals associated with the switching operation of comb filter 15 when of a CCD type comb filter.

A "combed" chrominance signal (C) from the chrominance output of comb filter 15 is applied to a chrominance signal processing unit 64 for generating R-Y, B-Y and G-Y color difference signals, and to an input of a low pass vertical detail filter 35. Unit 64 includes a filter suitable for passing only those signal frequencies from comb filter 15 which occupy the band of chrominance signal frequencies. Filter 35 exhibits a cut-off frequency of approximately 1.8 MHz, and selectively passes those signal frequencies present in the combed chrominance signal output of comb filter 15 which lie below this cut-off frequency. Signal frequencies in this region represent vertical detail luminance information which is absent from the combed luminance signal and which must be restored to the luminance signal to avoid loss of vertical resolution in the luminance content of a displayed image. Such vertical detail restoration as well as vertical detail enhancement is accomplished as follows.

Vertical detail signals from the output of filter 35 are coupled via a signal restoration path A including a low pass filter 42 and a weighting resistor 48, to one input of a signal combining network 60. Low pass filter 42 exhibits a cut-off frequency of approximately 2 MHz. The amplitude transfer characteristic of path A is linear and manifests a prescribed restoration gain for both positive and negative signal polarities. The magnitude of the restoration gain preferably corresponds to that amount of gain which, in a given system, is required to restore small amplitude excursions of the vertical detail component to the luminance signal so that an ultimately reconstituted luminance signal exhibits an essentially "flat" amplitude response with respect to small amplitude detail signals. In this connection it is noted that the magnitude of the restoration gain is a function of various factors, including the signal translating characteristics of networks coupled between the outputs of comb filter 15 and a luminance processor 32 which processes ultimately reconstituted luminance signals, and the relative magnitudes of the signals appearing at the outputs of comb filter 15, for example.

Vertical detail signals from filter 35 are also applied to a vertical detail enhancement signal processing path B, which comprises the cascade combination of a non-linear signal processing network 50, a low pass filter 52, and a signal weighting resistor 58. Signals processed by path B are applied to a second input of combining network 60, which combines the vertical detail restoration signals from path A with the vertical detail enhancement signals from path B to produce a desired output response as will be discussed.

The combination of vertical detail filter 35 with restoration filter 42 establishes the signal bandwidth of restoration path A, and the combination of vertical detail filter 35 with filter 52 establishes the signal bandwidth of enhancement path B, such that chrominance signal frequencies are greatly attenuated.

In this example, low-pass filter 52 exhibits a cut-off frequency of approximately 1.8 MHz for attenuating signal frequencies within and above the chrominance signal frequency band. Filter 52 serves to improve image definition particularly with respect to effects which may appear as visible disturbances along the edge of a displayed diagonal image pattern, as discussed in greater detail in a copending, concurrently filed U.S. patent application Ser. No. 38,204 of J. P. Bingham and W. A. Lagoni entitled "Image Detail Improvement In A Vertical Detail Enhancement System" and assigned to the present assignee.

Signal processor 50 includes a diode signal coring network of the general type shown in FIG. 2, including diodes 51 and 53 which are coupled in inverse parallel relationship and which conduct in response to opposite polarity signals, respectively. Additional details of coring circuits of this type can be found in U.S. Pat. No. 3,715,477 and in a copending, concurrently filed U.S. patent application Ser. No. 38,100 of W. A. Lagoni entitled "Signal Processing Circuit Having a Non-Linear Transfer Function".

The amplitude transfer characteristic of signal processor 50, and also the transfer characteristic for signals developed at the second input of combining network 60 via path B, is illustrated by FIG. 4. The following remarks concerning the response to positive (+) polarity signals also apply to signals of negative (−) polarity.

The coring, paring and amplifier circuits within processor 50 produce a signal amplitude transfer (gain) characteristic, as shown in FIG. 4, for three regions I, II and III with respect to three predetermined ranges of vertical detail signal amplitude. The coring circuit produces a response corresponding to zero gain within a first region for low level signals (e.g., signal amplitudes of about five percent of maximum expected amplitude). That is, the coring circuit inhibits the low level signals to prevent their enhancement in path B, along with noise and other undesired components. The amplifier stage within processor 50 amplifies vertical detail signals of moderate amplitude (e.g., signal amplitudes between about five percent and forty percent of maximum expected amplitude) within region II with a gain of approximately three, for example, to thereby emphasize the vertical detail information and increase picture contrast in this region.

Relatively large amplitude vertical detail signals (e.g., corresponding to high contrast images such as lettering) and "pared" (amplitude reduced or attenuated) as indicated by the amplitude response in region III, to avoid excessive image contrast and to prevent kinescope "blooming" which would otherwise distort or obscure picture detail.

A combined vertical detail signal produced at the output of combining unit 60 exhibits an amplitude characteristic in accordance with the amplitude transfer characteristic shown in FIG. 5. The transfer characteristic of FIG. 5 represents a composite transfer characteristic including the transfer characteristic of FIG. 3 (for restoration path A) combined with that of FIG. 4 (for enhancement path B). A circuit for producing the transfer function shown in FIG. 4 is described in detail in a copending, concurrently filed U.S. patent application Ser. No. 38,015 of W. A. Lagoni entitled "Controllable Non-Linear Processing of Video Signals", assigned to the present assignee, and is shown in FIG. 6.

Figure 6:
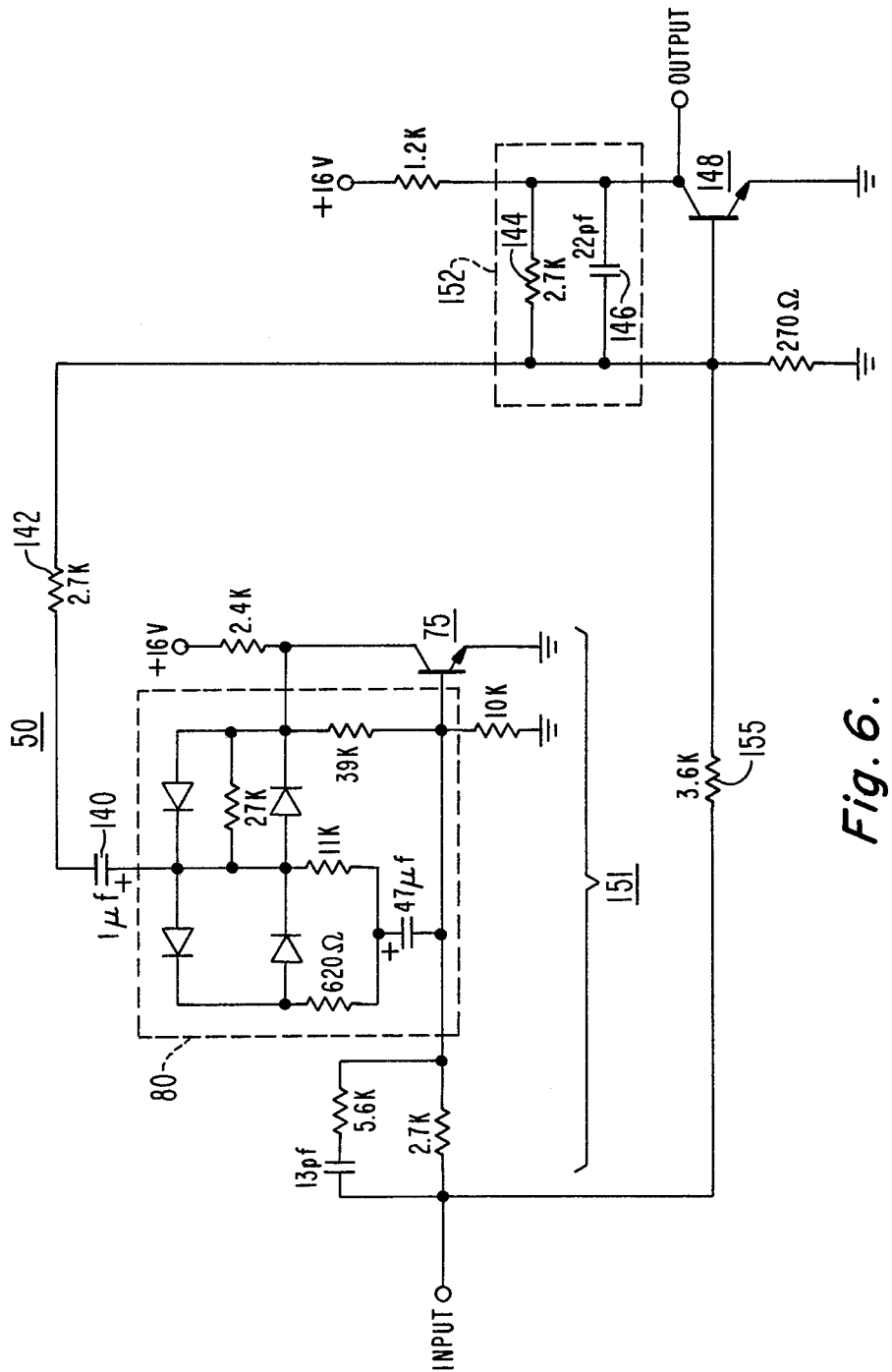
FIG. 6 shows circuit details of a portion of the arrangement of FIG. 1.

Specifically, FIG. 6 shows circuit details of non-linear signal processor 50 and filter 52 in signal path B. Linear detail signals from the output of vertical detail filter 35 are linearly translated with an amplitude transfer function of the form shown in FIG. 3, and are supplied as input signals to circuit 50. These input signals are translated with a non-linear amplitude transfer (gain) function by a non-linear signal processor circuit 151, which is described in detail in the copending U.S. patent application Ser. No. 038,100 of W. A. Lagoni mentioned previously.

Circuit 151 comprises an amplifier circuit including a base input transistor 75 and an associated feedback network 80. Signal processor circuit 151 manifests a non-linear composite amplitude transfer function for imparting different amounts of signal gain to signals having amplitudes within three designated ranges for both positive and negative signal polarities. The non-linearly processed output signals from processor 151 are coupled via a capacitor 140 and a summing resistor 142 to a base input of a transistor 148, where these signals are combined with detail signals coupled from the output of detail filter 35 (FIG. 1) via a summing resistor 155. The signals coupled via resistor 155 also exhibit a linear amplitude transfer function of the form shown in FIG. 3. Transistor 148 operates as an inverting feedback summing amplifier transistor, and the base electrode of transistor 148 represents a "virtual ground" summing point.

A non-linear amplitude transfer function of the form shown in FIG. 4 is associated with signals appearing at the collector output of transistor 148. Specifically, the level of signals appearing at the collector of transistor 148 are determined by the ratio of the value of a resistor 144 to the value of resistor 142, and by the ratio of the value of resistor 144 to the value of resistor 155. The ratio of the value of resistor 142 to the value of resistor 155 is selected so that small amplitude excursions of signals from circuit 151 after processing in region I substantially cancel with small amplitude excursions of signals linearly translated via resistor 155, when signals coupled via resistors 142 and 155 are combined in transistor 148, so as to produce the non-linear transfer function shown in FIG. 4 at the collector output of transistor 148 wherein small signal amplitudes are absent in region I.

A filter network 152 comprising resistor 144 and a capacitor 146 corresponds to filter network 52 in FIG. 1, for filtering output signals from circuit 50. The output signals from circuit 50 as developed at the collector of transistor 148 are combined in unit 60 (FIG. 1) with linearly translated detail signals coupled via filter 42, to produce a combined vertical detail signal at the output of unit 60 with an amplitude characteristic in accordance with the amplitude transfer characteristic shown in FIG. 5.

It is noted that in region I (vertical detail restoration), low level vertical detail signal information has been restored in an amount sufficient to preserve normal low level vertical resolution in the luminance content of a displayed image. The choice of the restoration gain as provided by the amplitude transfer response for region I (see FIGS. 1 and 3) involves considerations of what results are acceptable in a given video signal processing system. For example, if the restoration gain is excessive, low level ALSUV signal interference is likely to be visible. If the restoration gain is insufficient, significant combing effects (i.e., signal peaks and nulls at different frequencies) will appear in the vertical detail frequency region below 2 MHz, resulting in lost low level vertical detail information. Thus the slope of the amplitude transfer characteristic in region I corresponds to that amount of signal gain necessary to produce a desired response (e.g., a flat luminance response) without introducing unacceptable side effects. The signal amplitude response for region I, as determined by restoration path A, preferably exhibits a fixed relationship with the response of the signal path which couples the combed luminance signal from the output of the comb filter 15 to combiner 30.

In region II (vertical detail enhancement), an appropriate amount of vertical detail enhancement has been provided by imparting additional gain to signals of moderate amplitude in a manner which is considered to benefit vertical resolution of a displayed image. Since only signals processed by the enhancement path are cored and signals processed by the restoration path are translated with the restoration gain, image "smear" of low level vertical detail information is avoided and enhancement of undesirable low level signal components including noise and ALSUV interference is essentially eliminated or reduced to an acceptable minimum. The gain slope for signals within region III is less than that for signals within region II, and preferably is such that a gain less than the restoration gain is imparted to signals within region III. Detail signals subject to amplitude paring within region III are signals which exhibit an amplitude between about forty percent of maximum expected amplitude, and the maximum expected amplitude.

Low level signals subject to linear restoration in region I often contain subtle detail information which does not benefit significantly from enhancement, which would not be missed by a viewer if not enhanced, or which would appear objectionable to a viewer if enhanced. An example of signals of this type includes signals representative of facial images. The general configuration and characteristics of facial images are readily recognizable without detail enhancement. Facial images can contain minor irregularities such as lines or blemishes which, if emphasized by means of detail enhancement, may prove objectionable to a viewer who prefers seeing unblemished, pleasing facial images. An additional benefit is that interfering signals such as noise are not enhanced. The benefits obtained by processing signals within region I as discussed are considered to outweigh any lack of enhanced detail information for signals subject to processing in region I.

Detail signals subject to processing within region II are associated with such video signal information which is considered to benefit from vertical detail enhancement. Signals in this category include moderately large amplitude signals with nominal or average amounts of image contrast, such as signals representative of landscapes, flowers and cartoons, for example.

Detail signals subject to processing within region III are associated with such video signal information which is considered to benefit least from vertical detail enhancement. Signals of this type include large amplitude signals with large amounts of image contrast, such as may be associated with signals representative of lettering or black and white striped patterns, for example.

An additional benefit is obtained when provision is made for varying the amplitude transfer characteristics of regions II and III, without affecting the amplitude characteristics of signals subject to processing in region I. Such control can be accomplished either automatically or with a viewer adjustable potentiometer (i.e., a "peaking" control), as described in the aforementioned copending U.S. patent application Ser. No. 38,015 of W. A. Lagoni entitled "Controllable Non-Linear Processing of Video Signals".

It is also noted that the described vertical detail signal processing arrangement is unaffected by variations in the D.C. level of the luminance component. Due to the manner in which a comb filter derives a combed chrominance signal by employing a subtractive signal combining process as is known, the combed chrominance signal exhibits a zero D.C. component. The D.C. component of the chrominance signal therefore does not upset the D.C. bias component developed at the comb filter chrominance output. Coring of the vertical detail signal, as derived from the comb filter chrominance output, can therefore be accomplished predictably about the D.C. bias component which corresponds to the center of the "core". Since the reference level about which coring is accomplished is fixed predictably, the signal coring range is well-defined and assists to provide well-defined restoration, enhancement and paring regions as discussed.

The processed vertical detail signal appearing at the output of combining network 60 is summed in network 30 with the combed luminance signal supplied via filter 22. The output signal from combiner 30 corresponds to a reconstituted luminance component of the video signal with the vertical detail information thereof restored and enhanced as discussed. The reconstituted luminance component is afterwards coupled to luminance signal processing unit 32. An amplified luminance signal Y from unit 32 and the color difference signals from chrominance unit 64 are combined in a matrix 68 for providing R, B and G color image representative output signals. These signals are then suitably coupled to image intensity control electrodes of a color kinescope 70.

Signal weighting resistors 28, 48 and 58 are proportioned in value so that appropriate amounts of the combed luminance signal and processed vertical detail signals when combined produce a desired level of the luminance component which ultimately appears at the output of combiner 30. The signal propagation delays associated with paths A and B are equalized by means of the signal delays associated with filters 42 and 52. Also, the signal propagation delays between the luminance output of comb filter 15 and the first input of combiner 30 via path A, and the chrominance output of comb filter 15 and the second input of combiner 30 via path B, are equalized by means of the delay associated with filter 22 and the delay associated with filters 35, 42 and 52 in the vertical detail signal path.

Although combining networks 30 and 60 are shown as separate units in FIG. 1, it should be recognized that these two combining networks could be replaced by a single, three-input combining network for summing the combed luminance signal from comb filter 15 with the vertical detail signals coupled via paths A and B.

What is claimed is:

1. Video image vertical detail signal processing apparatus in a system for processing a video signal containing image representative luminance and chrominance components disposed within a frequency spectrum of said video signal in frequency interleaved relation, said system including comb filter means for providing at a first output a combed luminance signal with amplitude peaks at integral multiples of an image line scanning frequency and amplitude nulls at odd multiples of one-half said line frequency, and for providing at a second output a combed chrominance signal with amplitude peaks at odd multiples of one-half said line frequency and amplitude nulls at integral multiples of said line frequency, and wherein signals provided at said second output include signal frequencies representative of luminance vertical image detail information absent from said combed luminance signal at said first output, said apparatus comprising:

means coupled to said second output of said comb filter means for selectively passing said signal frequencies corresponding to vertical detail signal information, to the exclusion of signals occupying the band of chrominance signal frequencies;

means for translating small amplitude excursions of said vertical detail signal with a first gain greater than zero, for translating moderate amplitude excursions of said vertical detail signal with a second gain greater than said first gain, and for translating large amplitude excursions of said vertical detail signal with a third gain less than said first gain;

means for combining signals translated by said translating means with said combed luminance signal from said first output of said comb filter means to provide said luminance component; and luminance signal utilization means for receiving said luminance component from said combining means.

2. Apparatus according to claim 1, wherein said signal translating means comprises:
- a first signal path for translating said vertical detail signal with said first gain; and
- a second signal path for removing small amplitude excursions of said vertical detail signal, for translating moderate amplitude excursions of said vertical detail signal with a given gain, and for translating large amplitude excursions of said vertical detail signal with a gain less than said given gain; and
- means for combining the signals translated by said first and second signal paths.

3. Apparatus according to claim 1, wherein:
said frequency selective means comprises a low pass filter.

4. Video image vertical detail signal processing apparatus in a color television receiver for processing a color television signal containing image representative luminance and chrominance components disposed within a frequency spectrum of said television signal in frequency interleaved relation, said receiver including comb filter means for providing at a first output a combed luminance signal with amplitude peaks at integral multiples of an image line scanning frequency and amplitude nulls at odd multiples of one-half said line frequency, and for providing at a second output a combed chrominance signal with amplitude peaks at odd multiples of one-half said line frequency and wherein signals provided at said second output include signal frequencies representative of luminance vertical image detail information absent from said combed luminance signal at said first output, said apparatus comprising:
- means coupled to said second output of said comb filter means for selectively passing said signal frequencies corresponding to vertical detail signal information, to the exclusion of signals occupying the band of chrominance signal frequencies;
- means for translating small amplitude excursions of said vertical detail signal with a first gain greater than zero, for translating moderate amplitude excursions of said vertical detail signal with a second gain greater than said first gain, and for translating large amplitude excursions of said vertical detail signal with a third gain less than said first gain;
- means for combining signals translated by said translating means with said combed luminance signal from said first output of said comb filter means to provide said luminance component; and
- luminance signal utilization means for receiving said luminance component from said combining means.

* * * * *